United States Patent [19]

Whitmire et al.

[11] Patent Number: 4,823,086

[45] Date of Patent: Apr. 18, 1989

[54] BATTERY MONITORING AND CONDITION INDICATOR SYSTEM FOR MULTI-BATTERY PACK

[76] Inventors: Warren T. Whitmire, P.O. Box 983, Shalimar, Fla. 32579; Larry T. Anderson, 720 E. Sunset Blvd., Ft. Walton Beach, Fla. 32548

[21] Appl. No.: 217,147

[22] Filed: Jul. 1, 1988

Related U.S. Application Data

[63] Continuation of Ser. No. 946,769, Dec. 23, 1986, which is a continuation-in-part of Ser. No. 830,203, Feb. 18, 1986, abandoned.

[51] Int. Cl.$^4$ .......................................... G01N 27/46
[52] U.S. Cl. ..................................... 324/434; 324/433
[58] Field of Search .......................... 320/48; 340/636; 324/434, 433, 435

[56] References Cited

U.S. PATENT DOCUMENTS

| | | | |
|---|---|---|---|
| 4,020,243 | 4/1977 | Oldford | 429/93 |
| 4,020,414 | 4/1977 | Paredes | 324/29.5 |
| 4,024,523 | 5/1977 | Arnold et al. | 340/249 |
| 4,027,231 | 5/1977 | Lohrmann | 324/29.5 |
| 4,028,618 | 6/1977 | Teass, Jr. | 324/434 |
| 4,198,597 | 4/1980 | Sawyer | 324/434 |
| 4,316,185 | 2/1982 | Watrous et al. | 340/636 |
| 4,318,092 | 3/1982 | Cowles et al. | 340/636 |
| 4,389,609 | 6/1983 | Kawamura | 340/636 |
| 4,488,110 | 12/1984 | Shirey et al. | 324/133 |
| 4,560,937 | 12/1985 | Finger | 324/433 |
| 4,609,914 | 9/1986 | Fathi | 324/435 |
| 4,659,994 | 4/1987 | Poljak | 324/434 |

OTHER PUBLICATIONS

P. Scargill, Battery Condition Indicator, Practical Electronics, Jan. 1978, pp. 330-331.

Primary Examiner—Reinhard J. Eisenzopf
Assistant Examiner—Anthony L. Miele
Attorney, Agent, or Firm—Hale and Dorr

[57] ABSTRACT

Disclosed is a system for individually monitoring the condition of a single battery or each battery and related supply cables in a multi-battery battery pack. The system includes a means for positively indicating the condition of each battery in the battery pack. To monitor the condition of each battery, the system includes a means for comparing the voltage applied at the two terminals of each battery in the battery pack, and if this comparison reveals a deviation from a normal voltage difference, the system will indicate that the battery or related cables are faulty. For a properly operating battery the system will provide an indication that the battery is supplying the proper voltage, and when the voltage of any one of the batteries deviates from the standard, a system provides an indication that the particular batteries so deviate and will continue to show a deviation until reset even though the defective battery shows a normal voltage under a no load condition.

13 Claims, 3 Drawing Sheets

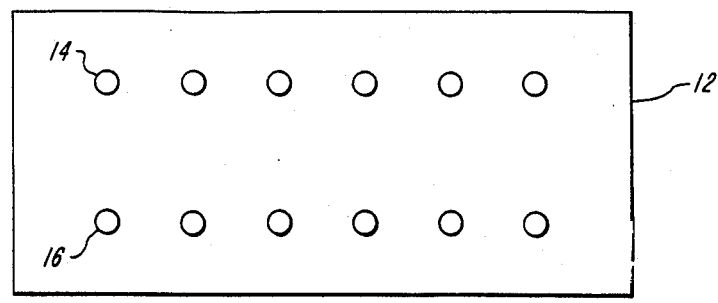
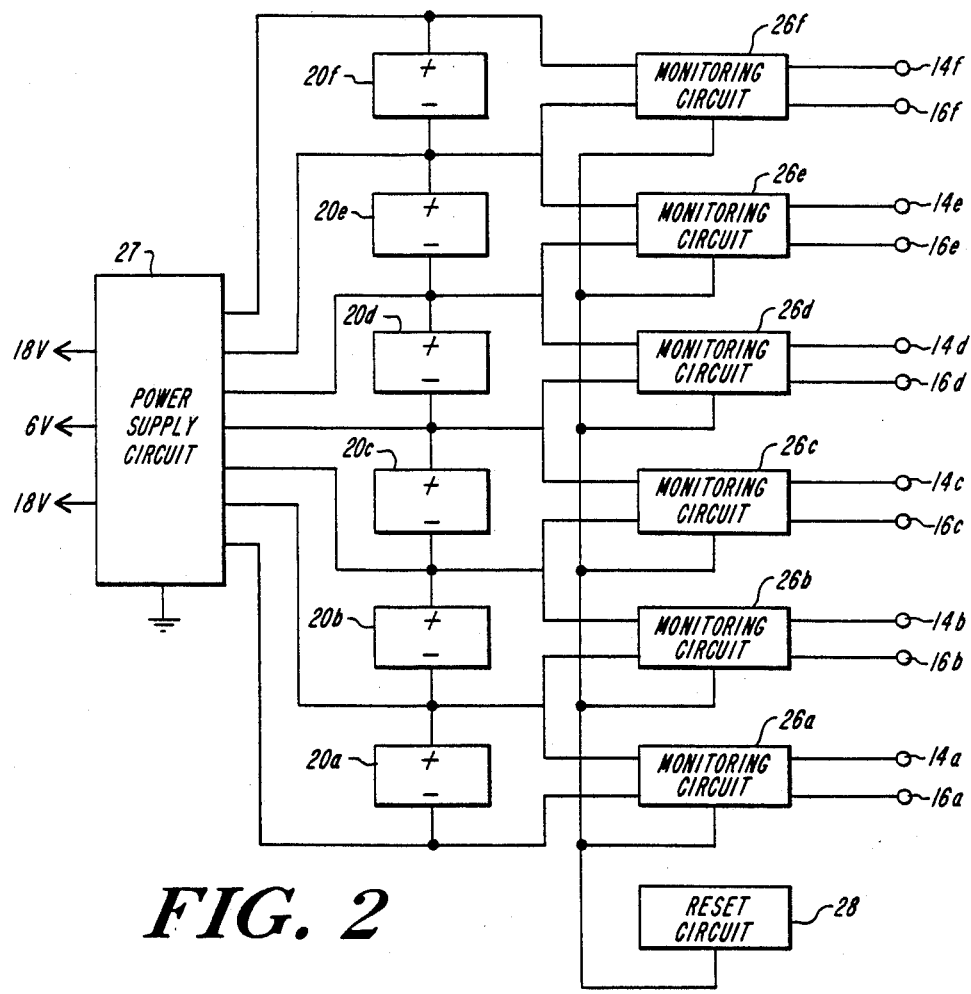

BATTERY MONITORING AND CONDITION INDICATOR SYSTEM FOR MULTI-BATTERY PACK

CROSS-REFERENCE TO RELATED APPLICATIONS

This is a continuation of co-pending application Ser. No. 946,769 filed on Dec. 23, 1986, which is a continuation-in-part of U.S. patent application Ser. No. 830,203 filed Feb. 18, 1986 entitled "Battery Monitoring and Condition Indicator System for Multi-Battery Pack."

BACKGROUND OF THE INVENTION

The present invention relates to a battery status or power condition indicator for a single battery used as a power source and more particularly to a system for determining the status or power condition of each battery and/or the condition of the related cable supply system connecting the batteries to the load in a multi-battery series power pack.

Power or work demands can be made upon battery power packs that have weak cells or batteries and/or high resistance cables without showing a noticeable loss in power output. This is especially true in devices that vary the voltage input to the load to control the speed or rate of work being done. This deficiency can go undetected and eventually cause a total failure of the battery pack. This type of failure can also occur in devices that apply the total pack output directly to the load. In any case, early detection of a power supply system defect will result in major savings in battery costs and as well as less down-time of equipment.

An example of a machine which is operated by a multi-battery pack is a typical electric golf cart. Such a golf cart may be powered by a battery pack comprising a series string of six-volt batteries of a type generally similar to an automobile battery. When the batteries are in a charged state and fully charged, each battery exhibits a voltage across its terminals of about 6.1 volts DC. This voltage drops slightly during peak loads. As the charge is gradually reduced in normal service, the terminal voltage tends to remain constant at about six volts, with a rapid drop towards zero as the battery becomes completely discharged.

Abnormally low terminal voltage of a battery or cell ordinarily indicates a very low charge condition, an extremely high level of loading or a defective cell. If one battery in a series of batteries, all of which have received the same maintenance and charge, has low terminal voltage, this is an indication of a faulty battery or a defective cable within the power supply system.

U.S. Pat. No. 4,198,597 issued to Sawyer discloses a detector for sensing a defective cell among a plurality of voltage-producing cells which together form a source of DC electrical power. When a cell becomes defective causing its voltage output to drop, the voltage produced by the remaining cells create a load current by which the defective cell goes negative and forward biases the corresponding light-emitting diode which emits light and identifies the defective cell. Such a device, however, is not reliable in a situation where the light emitting diode is defective or there is a malfunction or problem with other portions of the circuitry. In such a situation, even though a battery may be defective, the corresponding light-emitting diode will not light up to indicate a defective cell.

It is therefore a principal object of the present invention to provide a system for indicating the condition of each cell of a multi-battery battery pack and/or to isolate a defective cable connecting the batteries to the load.

A further object of the present invention is to provide a system for monitoring the condition of a plurality of batteries in a multi-battery battery pack which is simple in design, reliable and inexpensive to manufacture.

Still another object of the present invention is to provide a condition monitor for each battery in a multi-battery battery pack which is powered by the battery pack and "remembers" that condition after the load is removed even though the battery voltage rises after the load is removed.

SUMMARY OF THE INVENTION

According to the present invention, a system for monitoring the condition of each battery in a multi-battery battery pack and positively indicating the condition of each of the batteries is provided which includes means for sensing the voltage across terminals of each battery in the battery pack and means for detecting a deviation from normal voltage. In a normal condition, the system will provide an indication that the battery is operating under the proper voltage, and when the voltage of any one of the batteries deviates from the standard voltage, the system provides an indication that that particular battery so deviates and "remembers" that condition even though the battery voltage returns to normal under a low or no load condition. The system utilizes a minimum amount of power, and the system is powered by the battery pack itself.

These and other objects and features of the present invention will be more fully understood from the following detailed description which should be read in light of the accompanying drawings in which corresponding reference numerals refer to corresponding parts throughout the several views. Also, in the drawings, several identical parts will be identified with reference numerals followed by a letter. In such a case, where the part is referred to solely by the numeral, and one of the identical parts may be referred to for purposes of the description.

BRIEF DESCRIPTION OF THE DRAWING

FIG. 1 is a plan view of an operation panel which can be connected to an indicator system of the present invention;

FIG. 2 is a schematic view of a system of the present invention designed for use with a six-battery battery pack;

Figure 3:
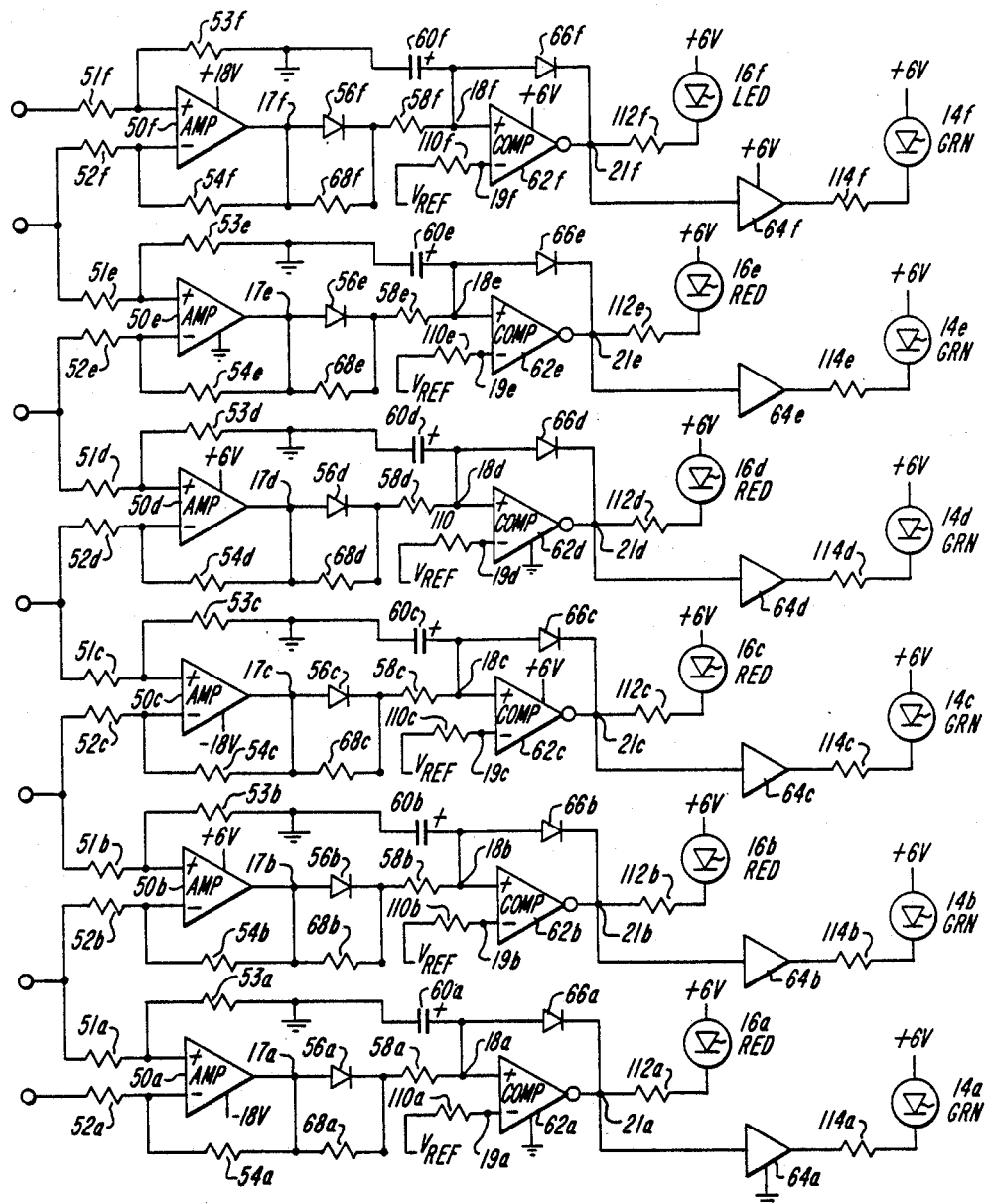
FIG. 3 is a schematic diagram of the detecting and indicating circuitry of the system of the present invention which is designed for use with a six-battery battery pack.

Appendix I is a listing of suitable, commercially available parts for the various electronic components shown in the FIGS. 1-5.

DETAILED DESCRIPTION OF THE PREFERRED EMBODIMENTS

The battery monitoring and condition indicator system of the present invention will be described with reference to a system which monitors and indicates the condition of six batteries in a six-battery battery pack. Referring to FIG. 1, a typical indicator panel 12 is shown which enables the system to provide a condition indication for each of the six batteries by lighting, in a preferred embodiment, a green light 14 for each battery operating at peak efficiency and a red light 16 for each weak battery. At all times, for each battery one of the lights 14 or 16 on the battery panel 12 will be lit indicating the status of the associated battery. In other words, either a green light 14 or a red light 16 will be lit for each battery in the battery pack.

Referring to FIG. 2, the batteries 20a, 20b, 20c, 20d, 20e, and 20f are stacked in a series. The negative and positive terminals of each of the batteries are then connected to monitoring units 26a-26f respectively as well as to a power supply circuit 27. Each of the monitoring units 26a-26f are in turn connected to a full power battery indicating device 14a-14f respectively (in the preferred embodiment a green LED) and to a weak battery indicating device 16a-16f respectively (in the preferred embodiment a red LED). A reset circuit 28 is also connected to each of the monitoring units 26a-26f.

The monitoring circuits 26a-26f are identical and independent. Each monitoring circuit 26a-26f monitors a separate battery 20a-20f in the six-battery battery stack. Using circuit 26d as an example the monitoring circuits will now be described in detail.

Operational amplifier 50d plus resistors 51d, 52d, 53d and 54d constitute a balanced DC amplifier. A suitable amplifier is a TL 082. Since the resistance of resistors 51d-54d is equal, the gain is unity. A suitable value for resistors 51d-54d is 22 K ohms. The grounding of resistor 53d causes the potential difference between resistors 51d and 52d to appear at junction 17d as a voltage referenced to circuit ground. This is necessary to allow the use of a common reference voltage thereby allowing for a common reset for all six monitoring circuits 26a-26f.

The voltage at junction 17d is connected through diode 56d and resistor 58d and charges capacitors 60d. This voltage is connected to the positive input of the comparator 62d. The negative input of the comparator 62d is connected to the reference voltage. A suitable reference voltage is 4.4 volts. When the voltage across the battery 20d is equal to 6 volts the voltage at junction 17d will be 6 volts. The voltage at junction 18d will be approximately 5.4 volts due to the voltage drop across diode 56d. Since the 4.4 volts applied to junction 19d is lower than the voltage at junction 18d, the voltage at junction 20d will be positive and approximately equal to 6 volts.

This positive voltage will cause light emitting diode (LED) 16d to be turned off. This positive voltage is inverted by inverter 64d whose output is low or near ground potential. This causes the full power indicating device to be turned on by causing current to flow through the green LED 14d. Diode 66d has no effect in this condition since the cathode is at greater potential than the anode.

If the voltage across battery 20d drops below 5 volts, the voltage at junction 17d will also drop below 5 volts. The voltage at junction 18d will drop below 4.4 volts. This will cause the voltage at junction 18d to be less than the voltage at junction 19d, and the output of comparator 62d will be low or near ground potential. The weak battery indicating device will be turned on since current will flow through LED 16d. The output of inverter 64d will then be high or near 6 volts causing LED 14d to be turned off.

Since the anode of diode 66d is now higher than the cathode by at least 0.6 volts the diode 66d will conduct and pull junction 18d down to approximately 1 volt. This has the effect of latching the circuit in the low voltage state. If the voltage across the battery 20d rises above 5 volts, diode 66d will prevent the voltage at junction 18d from rising. The circuit may be reset by switch 67 which momentarily lowers the reference voltage to 0 volts. This causes the voltage at junction 18d to be higher than the voltage at junction 19d. The output of comparator 62d will then be high and diode 66d will cease to conduct.

Resistor 68d and capacitor 60d provide a time constant that prevents noise in the circuit voltage, such as that caused by starting a motor, from being detected as a fault. Diode 56d bypasses resistor 68d for faster response to voltage increases since without diode 56d repeated short voltage drops might discharge capacitor 60d which would cause a fault indication.

Figure 4:
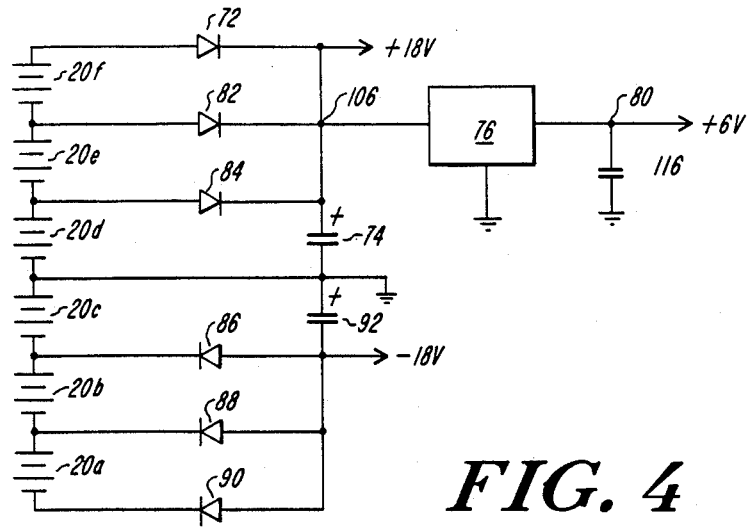
FIG. 4 is a schematic diagram of the power supply circuitry of the system of the present invention which is designed for use with a six-battery battery pack; and, FIG. 5 is a schematic diagram of the reset circuitry of the system of the present invention.

The power supply circuitry of a preferred embodiment is shown in detail in FIG. 4. Diode 72 and capacitor 74 provide +18 volts to voltage regulator 76 which provides a regulated +6 volts at junction 80. This regulation is necessary to prevent noise from the external load (motors, relays, etc.) from false triggering the comparators and causing fault indication, +18 volts is also supplied to amplifiers 50f and 50e. Diodes 82 and 84 are necessary to supply voltage to regulator 76 in the event battery 20e or battery 20f and battery 20e fail. Diodes 86, 88 and 90 capacitor 92 supply −18 volts for amplifiers 50a and 50b.

Figure 5:
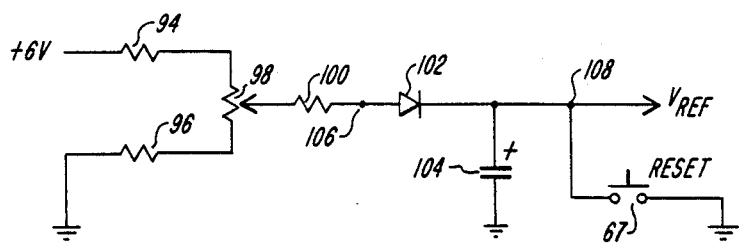

The reset circuitry of a preferred embodiment is shown in FIG. 5. Resistors 94, 96, 98 and 100, diode 102 and capacitor 104 supply the reference voltage to the comparators 62a-62f. Diode 102 is provided to compensate for the diodes 56a-56f connected to the outputs of the operational amplifiers 50a-50f. This reference voltage may be set by adjusting resistor 98 while monitoring junction 106 for the desired voltage. The desired reference voltage in a preferred embodiment is approximately 4.4 volts at junction 108.

Amplifiers 50f and 50e are powered from +18 volts and ground since the input voltages to these amplifiers range from +6 and +18 volts with respect to system ground. Amplifiers 50c and 50d are powered from +6 and −18 volts since the input voltages to these amplifiers range from −6 to +6 volts with respect to system ground. Amplifiers 50a and 50b are powered from +6 and −18 volts since the input voltages to these amplifiers range from −18 to −6 volts with respect to system ground. This is necessary to prevent the inputs from exceeding the power supply voltages connected to the amplifiers. The comparators 62a-62f are powered from +6 volts and system ground since their inputs only see 0 to +6 volts.

While the foregoing invention has been described with reference to its preferred embodiments, various modifications and alterations will occur to those skilled in the art. For example, while the system of the present invention has been described with reference to six batteries, such a system can of course be manufactured to accomodate any number of batteries in a series or cells in one battery application or parallel series application of batteries. In addition, the entire circuit package with the exception of the LEDs might be integrated into a monolithic circuit element (integrated circuit) to simplify production and reduce costs. These and all other variations and modifications are intended to fall within the scope of the appended claims.

APPENDIX I

| | | |
|---|---|---|
| Resistors 51, 52, 53, 54, 58, 110 | 22K ohms | (6 places) |
| Resistor 68 | 1 M ohms | (6 places) |
| Resistors 112, 114 | 1K ohms | (6 places) |
| Resistor 100 | 1K ohms | (6 places) |
| Resistor 94 | 820 ohms | (6 places) |
| Resistor 96 | 1.8K ohms | (6 places) |
| Resistor 98 | 10K ohms | (6 places) |
| Amplifier 50 | TL 082 | (3 used) |
| Comparator 62 | LM 339 | (2 used) |
| Inverter 64 | CD 4049 | |
| LEDs 14, 16 | 35BL505/6 | (6 places) |
| Diodes 56, 66 | 1N4148 | |
| Diodes 102 | 1N4148 | |
| Regulator 76 | 7806 | |
| Capacitor 60 | 1.0 mfd | (6 places) |
| Capacitors 92, 74 | 100 mfd | |
| Capacitor 116 | 0.1 mfd | |
| Capacitor 104 | 10 mfd | |

What is claimed is:

1. A system for individually monitoring the condition of each battery and connecting cables in a multi-battery battery pack under load in order to provide a warning of possible battery pack failure, said system comprising:
    means for detecting a voltage difference between two terminals of each of said batteries;
    means responsive to said detecting means for positively indicating a battery condition for each of said batteries, each of said battery condition indicating means being independent of every other battery condition indicating means, said battery condition indicating means always indicating by means of one of two indicators always being activated, first of said indicators indicating a continuous acceptable working potential, second of said indicators indicating either a low working potential or an initial temporary drop in working potential by remaining activated until being manually reset by a means for resetting said indicators.

2. The battery condition monitoring device of claim 1 wherein said detecting means comprises:
    an operational amplifier connected as a unity gain non-inverting amplifier across an individual battery, said amplifier connected to the positive terminal of a voltage comparator, said comparator having a positive reference voltage connected to its negative terminal;
    said comparator providing a first output which is a positive voltage signal when the battery voltage is greater than the reference voltage and a second output which is substantially zero volts when the battery voltage is lower than the reference voltage.

3. The battery condition monitoring system of claim 2 wherein said indicating means comprises:
    a first color light emitting diode capable of being driven by said first output and a second color light emitting diode capable of being driven by said second output.

4. The battery condition monitoring system of claim 1 further comprising a means for eliminating false alarms caused by inductive loads.

5. A system for individually monitoring the condition of each battery and connecting cables in a multi-battery battery pack under load in order to provide a warning of a possible battery pack failure, said system comprising:
    a voltage comparator associated with each battery in the battery pack, each of said comparators having its positive input connected through a unity-gain operational amplifier to a positive terminal of its associated battery and having its negative input connected to a common reference voltage, said comparators providing a first output when a difference between a voltage on said negative and positive terminals exceeds a reference level and a second output when said voltage difference is less than said reference level;
    means for storing said first or second output with said second output being permanently stored until manually reset;
    means associated with each of said comparators and responsive to said output of said comparators for positively indicating a battery condition for each of said batteries, each of said battery condition indicating means being independent of every other battery condition indicating means, said battery condition means always indicating by means of one of two indicators always being activated, first of said indicators indicating a continuous acceptable working potential, second of said indicators indicating either a low working potential or an initial temporary drop in working potential by remaining activated until being manually reset by a means for resetting said indicators.

6. The battery condition monitoring system of claim 5 wherein said indicating means comprises a first color light emitting diode capable of being driven by said first output, and a second color light emitting diode capable of being driven by said second output.

7. The battery condition monitoring system of claim 6 wherein said first color is green, and said second color is red.

8. The battery condition monitoring system of claim 5 further comprising a means for eliminating false alarms caused by inductive loads.

9. A system for individually monitoring the condition of each battery in a multi-battery pack comprising:
    means for monitoring the condition of each of said batteries;
    means responsive to said monitoring means for always indicating by means of one of two indicators always being activated, first of said indicators indicating a continuous acceptable working potential, second of said indicators indicating either a low working potential or an initial temporary drop in working potential by remaining activated until being manually reset by a means for resetting said indicators.

10. A system for individually monitoring the condition of each battery and connecting cables in a multi-battery battery pack under load in order to provide a warning of a possible battery pack failure, said system comprising:
    a monitoring circuit associated with each battery in the battery pack, each of said monitoring circuits including a comparator having its positive input connected through a balanced unity-gain DC operational amplifier to a positive terminal of its associated battery and having its negative input connected to a common non-zero reference voltage, said amplifier having a feedback resistor connected to ground in order to allow the use of a common reference voltage and a common means for resetting all of said monitoring circuits, said comparators providing a first output when a difference between a voltage on said positive and negative terminals exceeds a reference level and a second output when said voltage difference is less than said reference level;

means for storing said second output condition until said means for resetting all of said monitoring circuits is activated;

means associated with each of said comparators and responsive to said output of said comparators for positively indicating a battery condition for each of said batteries, each of said battery condition indicating means being independent of every other battery condition indicating means, said battery condition indicating means positively indicating either a continuous acceptable working voltage potential or a single drop from said acceptable working voltage potential at all times while said system is operating under normal working load;

said means for resetting all of said monitoring circuits including a means for momentarily lowering the reference voltage to 0 volts.

11. The battery condition monitoring system of claim 10 wherein said indicating means comprises a first color light emitting diode capable of being driven by said first output, and a second color light emitting diode capable of being driven by said second output.

12. The battery condition monitoring system of claim 11 wherein said first color is green, and said second color is red.

13. A system for monitoring the condition of a battery under load in order to provide a warning of possible battery failure, said system comprising:

means for detecting a voltage difference between two terminals of said battery;

means responsive to said detecting means for always indicating by means of one of two indicators always being activiated, first of said indicators indicating a continuous acceptable working potential, second of said indicators indicating either a low working potential or an initial temporary drop in working potential by remaining activated until being manually reset by a means for resetting said indicators.

* * * * *